(12) United States Patent
Nguyen

(10) Patent No.: US 6,285,226 B1
(45) Date of Patent: Sep. 4, 2001

(54) DUTY CYCLE CORRECTION CIRCUIT AND METHOD

(75) Inventor: Andy T. Nguyen, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 09/427,143

(22) Filed: Oct. 25, 1999

(51) Int. Cl.[7] .................................................. H03K 5/04
(52) U.S. Cl. .......................... 327/175; 327/176; 327/122; 327/269; 327/291; 375/238
(58) Field of Search ................................. 327/172–175, 327/165, 176, 291, 261, 263, 269, 271, 277, 122; 375/371, 238, 239; 326/93

(56) References Cited

U.S. PATENT DOCUMENTS

| | | | | |
|---|---|---|---|---|
| 5,245,637 | * | 9/1993 | Gersbach et al. | 375/374 |
| 5,537,069 | * | 7/1996 | Volk | 327/149 |
| 5,994,938 | * | 11/1999 | Lesmeister | 327/277 |
| 6,040,726 | * | 3/2000 | Martin | 327/175 |
| 6,100,735 | * | 8/2000 | Lu | 327/158 |

* cited by examiner

Primary Examiner—Timothy P. Callahan
Assistant Examiner—Minh Nguyen
(74) Attorney, Agent, or Firm—Lois D. Cartier

(57) ABSTRACT

A duty cycle correction circuit and method that accept an unsymmetrical input clock signal and provide therefrom an output clock signal having a 50% duty cycle. One circuit according to the invention includes an input clock terminal supplying a input clock signal, and a delay line driven by the input clock signal and supplying a plurality of intermediate clock signals delayed from the input clock signal by incremental unit delays. A clock multiplexer selects from among these intermediate clock signals, under control of a multiplexer control circuit, the clock signal that is most nearly 180 degrees offset from the input clock signal. The selected clock signal is then combined with the input clock signal in an output clock generator to generate an output clock signal having a 50% duty cycle. In one embodiment, the duty cycle correction circuit includes a delay stage comprising a delay element that can selectively add a half-unit delay to the input clock signal.

18 Claims, 7 Drawing Sheets

DUTY CYCLE CORRECTION CIRCUIT AND METHOD

FIELD OF THE INVENTION

The invention relates to integrated circuits (ICs). More particularly, the invention relates to a duty cycle correction circuit and method for an IC.

BACKGROUND OF THE INVENTION

Clock signals are used in virtually every IC and electronic system to control timing. For example, every time there is a rising edge on a clock signal, all the flip-flops in a circuit may change state. Frequently, both edges (rising and falling) of the clock signal are used. For example, in a Master-Slave flip-flop, data is read into the flip-flop on one edge of the clock signal, and then appears at the output terminal of the flip-flop on the other edge. Since the Master-Slave flip-flop is performing logic functions during each half of the clock cycle, the two states of the clock (high and low) are preferably each of approximately equal length. (This condition is called a "50% duty cycle".) If one state is appreciably longer than the other, the clock signal is "unsymmetrical" (e.g., the clock signal is low longer than it is high). This limitation is not uncommon; for example, duty cycles of about 10% (i.e., 10% high, 90% low) are often seen. Under these conditions, the frequency at which a circuit can operate may be limited by the length of the shorter state (e.g., by the length of time that the clock signal is high). Therefore, the circuit operates at an unnecessarily low frequency.

To overcome this limitation, circuit designers can extract a 50% duty cycle clock from an unsymmetrical clock signal using a phase-lock loop (PLL) circuit. However, a PLL circuit consumes a great deal of silicon area. Additionally, PLLs are often analog in nature and take an extremely long time to simulate, and a design that works in one manufacturing process may stop working when manufactured using another process. Therefore, PLLs are very difficult to design, and often are not feasible in a given circuit or system. Therefore, duty cycle correction is often not possible using known circuits and methods.

Therefore, it is desirable to provide a duty cycle correction circuit and method that enables a circuit designer to correct an unsymmetrical clock to a 50% duty cycle, using a fairly simple circuit that consumes a relatively small amount of silicon area.

SUMMARY OF THE INVENTION

The invention provides a duty cycle correction circuit and method that accept an unsymmetrical input clock signal and provide therefrom an output clock signal having a 50% duty cycle. A circuit according to the invention includes an input clock terminal supplying an input clock signal, and a delay line driven by the input clock signal and supplying a plurality of intermediate clock signals delayed from the input clock signal by incremental unit delays. A clock multiplexer selects from among these intermediate clock signals, under control of a multiplexer control circuit, the clock signal that is most nearly 180 degrees offset from the input clock, i.e., the clock signal subject to a delay closest to but not exceeding half of one input clock period. The input clock signal is appropriately delayed to compensate for the delay through the clock multiplexer, then combined with the selected clock signal in an output clock generator that provides an output clock signal having a 50% duty cycle. (The term "50% duty cycle" is used herein to describe a duty cycle wherein the high pulse and the low pulse are within one unit delay of each other in length.)

The multiplexer control circuit essentially counts the number of unit delays between first (e.g., rising) edges of the input clock signal. This total number of unit delays is divided by two, thus supplying the desired number of unit delays between the first (e.g., rising) and the second (e.g., falling) edges of the output clock signal. This number is used to select the correct intermediate clock signal, i.e., the clock signal subject to a delay closest to but not exceeding half of one input clock period.

In one embodiment, the duty cycle correction circuit includes an option to disable the circuit. A disable control signal is applied to the output clock generator to select the input clock signal as the output clock signal. Therefore, no duty cycle correction is performed.

In another embodiment, the duty cycle correction circuit includes a preliminary delay stage for the delay line. The preliminary stage comprises a delay element that can selectively add either a full unit delay or a half-unit delay to the input clock signal. Using this additional delay element, the duty cycle correction circuit can supply a clock more nearly offset by 180 degrees. If the clock period spans an odd number of unit delays, the half-unit delay is inserted. If the clock period spans an even number of unit delays, a full unit delay is inserted, and the circuit operates as described above. In other embodiments, rather than adding a selectable half/full unit delay element at the beginning of the delay line, the first stage of the delay line is modified to offer a half/full unit delay option, or a full/one-and-a-half unit delay option. As long as corresponding changes are made to the select generation circuitry, as is easily done by those of ordinary skill in the art, any of these or similar changes to the delay line are easily accommodated by the circuits and methods of the invention.

In yet another embodiment, a status generator circuit is provided that provides a status signal after a predetermined number of clock cycles have elapsed. This status signal may be used by other circuits to disable the output clock signal until the output clock signal has settled into a reliably predictable pattern.

BRIEF DESCRIPTION OF THE DRAWINGS

The present invention is illustrated by way of example, and not by way of limitation, in the following figures, in which like reference numerals refer to similar elements.

DETAILED DESCRIPTION OF THE DRAWINGS

In the following description, numerous specific details are set forth to provide a more thorough understanding of the present invention. However, it will be apparent to one skilled in the art that the present invention may be practiced without these specific details.

First Embodiment

Figure 1A:
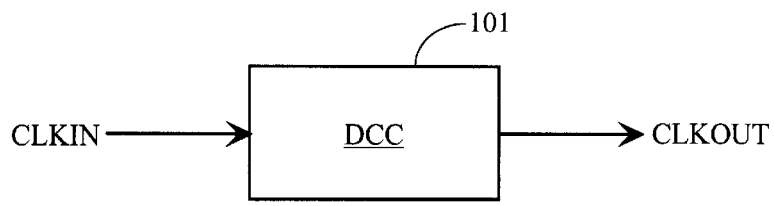
FIG. 1A is a simple block diagram of a duty cycle control circuit (DCC circuit), showing the input and output signals.
Figure 1B:
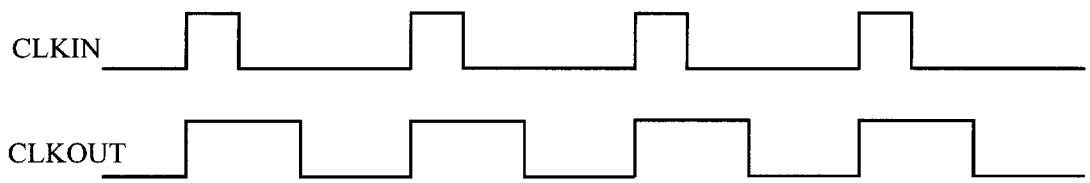
FIG. 1B is a timing diagram showing the interrelationship between the input and output signals of the DCC circuit of FIG. 1A.

FIG. 1A is a simple block diagram of a duty cycle correction circuit (DCC circuit) 101, showing the input clock terminal CLKIN and the output clock terminal CLKOUT. FIG. 1B shows the corresponding signals. (In the present specification, the same reference characters are used to refer to terminals, signal lines, and their corresponding signals.) As shown in FIG. 1B, the input clock signal CLKIN is an "unsymmetrical" clock having a high pulse much shorter than the low pulse. However, the output clock signal CLKOUT, having been "corrected" by the DCC circuit, has a 50% duty cycle. Note that FIG. 1B shows the rising edge of the CLKOUT signal occurring simultaneously with the rising edge of the CLKIN signal, although there is necessarily a delay incurred by passing through the circuit. The timing diagrams herein do not reflect timing delays through the various circuit elements, in order to clarify the functionality of the circuits.

Figure 2:
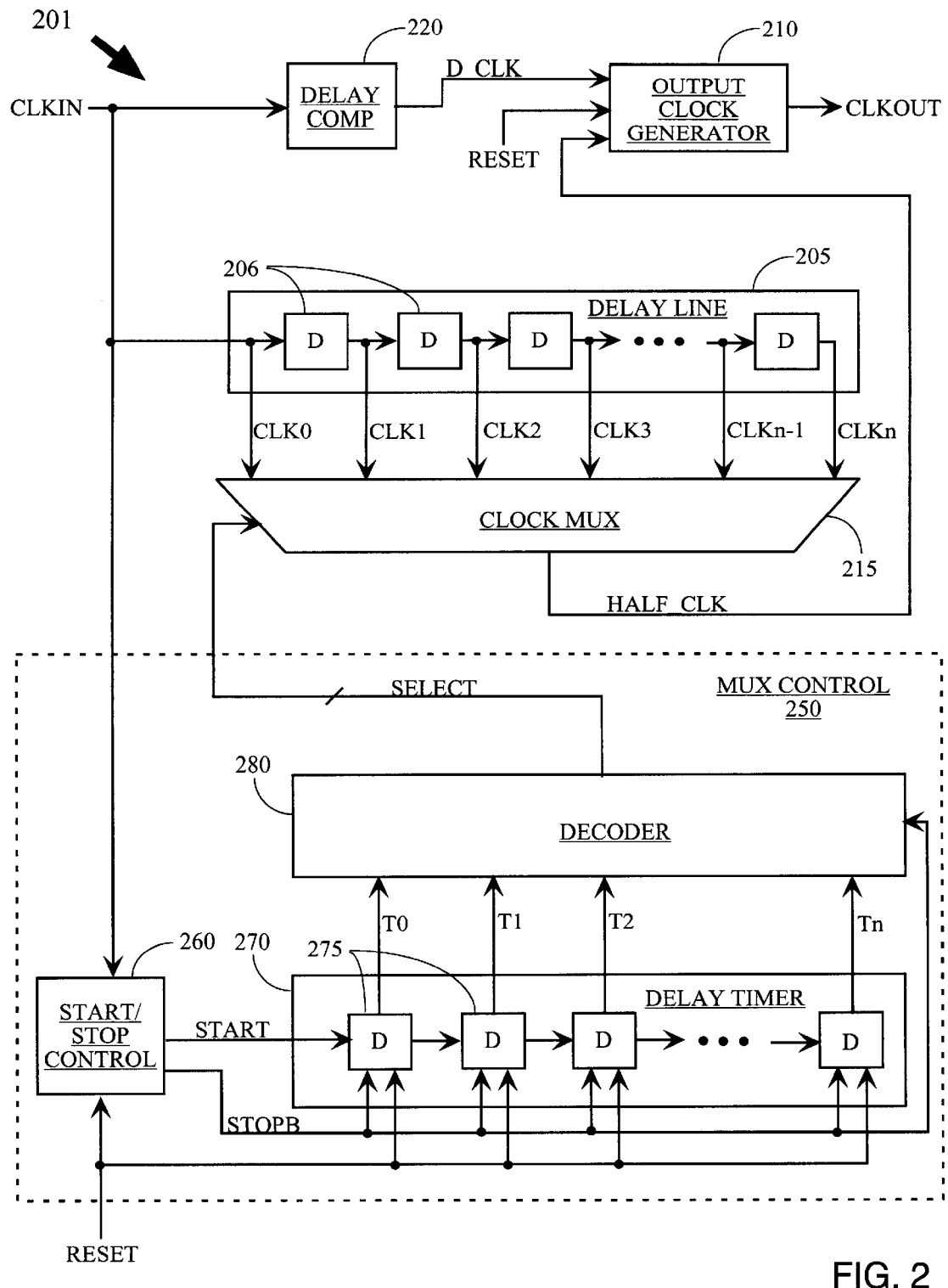
FIG. 2 is a block diagram of a first embodiment of the invention.

FIG. 2 shows a block diagram of DCC circuit 201 according to one embodiment of the invention. The DCC circuit of FIG. 2 includes a delay line 205, a clock multiplexer 215, a delay compensation element 220, an output clock generator 210, and a multiplexer control circuit 250. An input clock signal CLKIN drives delay compensation element 220 and delay line 205. Delay compensation element 220 delays input clock signal CLKIN by a predetermined time, and passes delayed input clock signal D_CLK to output clock generator 210. Delay line 205 provides from input clock signal CLKIN a plurality of intermediate clock signals (CLK0, CLK1, . . . , CLKn) to clock multiplexer 215, which selects one of the intermediate clock signals and provides the selected signal as signal HALF_CLK to output clock generator 210. Clock multiplexer 215 is controlled by SELECT signals from multiplexer control circuit 250.

Delay line 205 comprises a series of delay elements 206, each having a delay of one "unit delay". A unit delay can be any period of time appropriate to the application of the DCC circuit. For example, a unit delay can be measured in tens, hundreds, or thousands of picoseconds, or even longer periods of time, particularly for non-IC applications. Delay line 205 provides a plurality of intermediate clock signals CLK0, CLK1, . . . , CLKn, respectively delayed by 0, 1, . . . , n unit delays from the input clock signal CLKIN.

Clock multiplexer 215 (under control of multiplexer control circuit 250) selects the intermediate clock signal subject to a delay closest to but not exceeding half of one input clock period (HALF_CLK), as described below. Meanwhile, input clock signal CLKIN is delayed by an appropriate amount of time by delay compensation element 220 to compensate for the delay through clock multiplexer 215. (Delay compensation element 220 is optional in some cases, for example, where the delay through clock multiplexer 215 is smaller than the unit delay.) Output clock generator 210 then combines the selected clock signal HALF_CLK with the delayed input clock signal D_CLK to provide an output clock signal CLKOUT with the same period as the input clock signal, but with a 50% duty cycle.

An output clock signal CLKOUT having these characteristics is easily generated by using the delayed input clock signal D_CLK to trigger the first (e.g., rising) edge of the output clock signal CLKOUT, and using the selected clock signal HALF_CLK to trigger the second (e.g., falling) edge of the output clock signal CLKOUT. For example, output clock generator 210 is easily implemented as a set-reset (SR) latch, with a rising edge of delayed input clock signal D_CLK setting the latch and a rising edge of selected clock signal HALF_CLK resetting the latch. In one embodiment, a RESET signal also resets the SR latch, whereby when the circuit is in a reset state (e.g., the RESET signal is high), the output clock signal CLKOUT is always held low.

Multiplexer control circuit 250 is responsible for selecting the correct intermediate clock signal to supply the second edge of the output clock signal (the first edge being supplied by the input control signal). In the embodiment of FIG. 2, multiplexer control circuit 250 includes a Start/Stop control circuit 260, a delay timer circuit 270, and a decoder 280. Under control of Start/Stop control circuit 260, delay timer 270 counts the number of unit delays between first (e.g., rising) edges of input clock signal CLKIN. Decoder 280 effectively divides this number by two, thus supplying the desired number of unit delays between the first (e.g., rising) and second (e.g., falling) edges of output clock signal CLKOUT. Decoder 280 therefore supplies the select signals to clock multiplexer 215 to select the intermediate clock signal subject to a delay closest to but not exceeding half of one input clock period.

In one embodiment, Start/Stop control circuit 260 operates as follows. On the first rising edge of the CLKIN signal, the START signal goes high while the STOP signal remains low (i.e., the STOPB signal remains high). On the second rising edge of the CLKIN signal, the STOP signal goes high (i.e., the STOPB signal goes low), and both START and STOP signals remain high until the circuit is reset. In one embodiment, the signals are reset by a reset signal received from outside the DCC circuit.

The START signal feeds into delay timer 270. All stages of delay timer 270 have a low value prior to the START signal going high. In one embodiment, this low value is assured by the same reset signal that is used to reset the START and STOP signals. When the START signal goes high, the high voltage level is passed along the delay chain (from left to right in FIG. 2). Each stage 275 of delay timer 270 has a delay of one unit delay, the same delay as in delay line 205, above. As long as the START signal is high and the STOP signal is low (i.e., for one clock period), one additional stage 275 of delay timer 270 goes high for each unit delay. For example, if the clock period is m unit delays in length, then m stages 275 of delay timer 270 are high (starting from the left, i.e., bits T0, T1, . . . , Tm−1 are high) and the rest of the stages are low, when the STOP signal goes high and stops transmission of the START signal from left to right along the delay chain. In one embodiment, the STOP signal is also used to disable the decoder 280 until the delay timer has completed the transmission of the START signal.

In one embodiment, delay timer circuit 270 is implemented as a simple counter. However, the use of a series of unit delays enables the delay through delay timer circuit 270 to closely track the delay through delay line 205. Therefore, in applications where such delays are process-dependent, as in integrated circuits, the illustrated implementations are preferred.

Decoder 280 receives the n+1 bits T0, T1, ..., Tn from the delay timer. Of the bits with a high value, the central bit is identified and is used to select the correct intermediate clock signal. For example, if there are 30 unit delays in one clock period, then the intermediate clock signal delayed by 15 unit delays is selected. If there are an odd number of unit delays in one clock period, in this embodiment the "extra" unit delay is ignored. For example, if there are 31 unit delays in one clock period, then the intermediate clock signal delayed by 15 unit delays is selected. In the second embodiment, described below in connection with FIG. 4, an additional half-delay is inserted and an intermediate clock signal delayed by 15-½ unit delays is selected, more nearly providing an exact 50% duty cycle. However, a duty cycle offset by no more than one unit delay from an exact 50% duty cycle is sufficient for many applications.

Second Embodiment

Figure 3A:
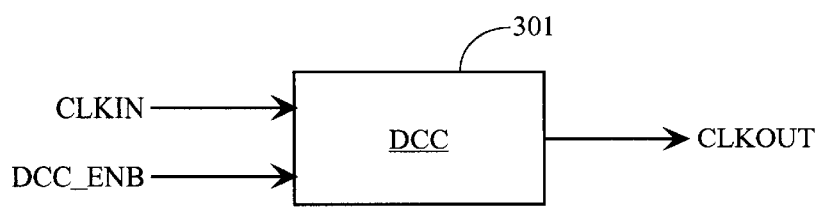
FIG. 3A is a simple block diagram of a DCC circuit according to another embodiment of the invention, showing the input and output signals.
Figure 3B:
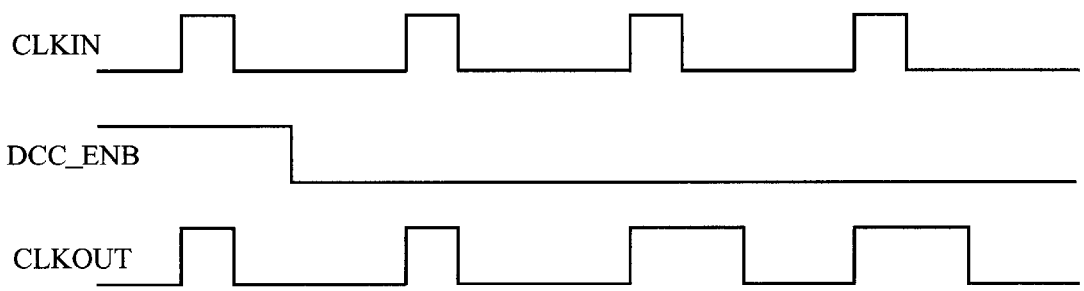
FIG. 3B is a timing diagram showing the interrelationships among the input and output signals of the DCC circuit of FIG. 3A.

FIG. 3A is a simple block diagram of a duty cycle correction circuit (DCC circuit) 301 for another embodiment of the invention, showing input clock terminal CLKIN, an active-low enable input terminal DCC_ENB, and output clock terminal CLKOUT. FIG. 3B shows the corresponding signals. As shown in FIG. 3B, DCC circuit 301 is controlled by enable signal DCC_ENB to provide an output clock signal CLKOUT that is either a delayed version of input clock signal CLKIN or a "corrected" version of input clock signal CLKIN having a 50% duty cycle. (As in FIG. 1B, the delay between signals CLKIN and CLKOUT is not shown.)

Figure 4:
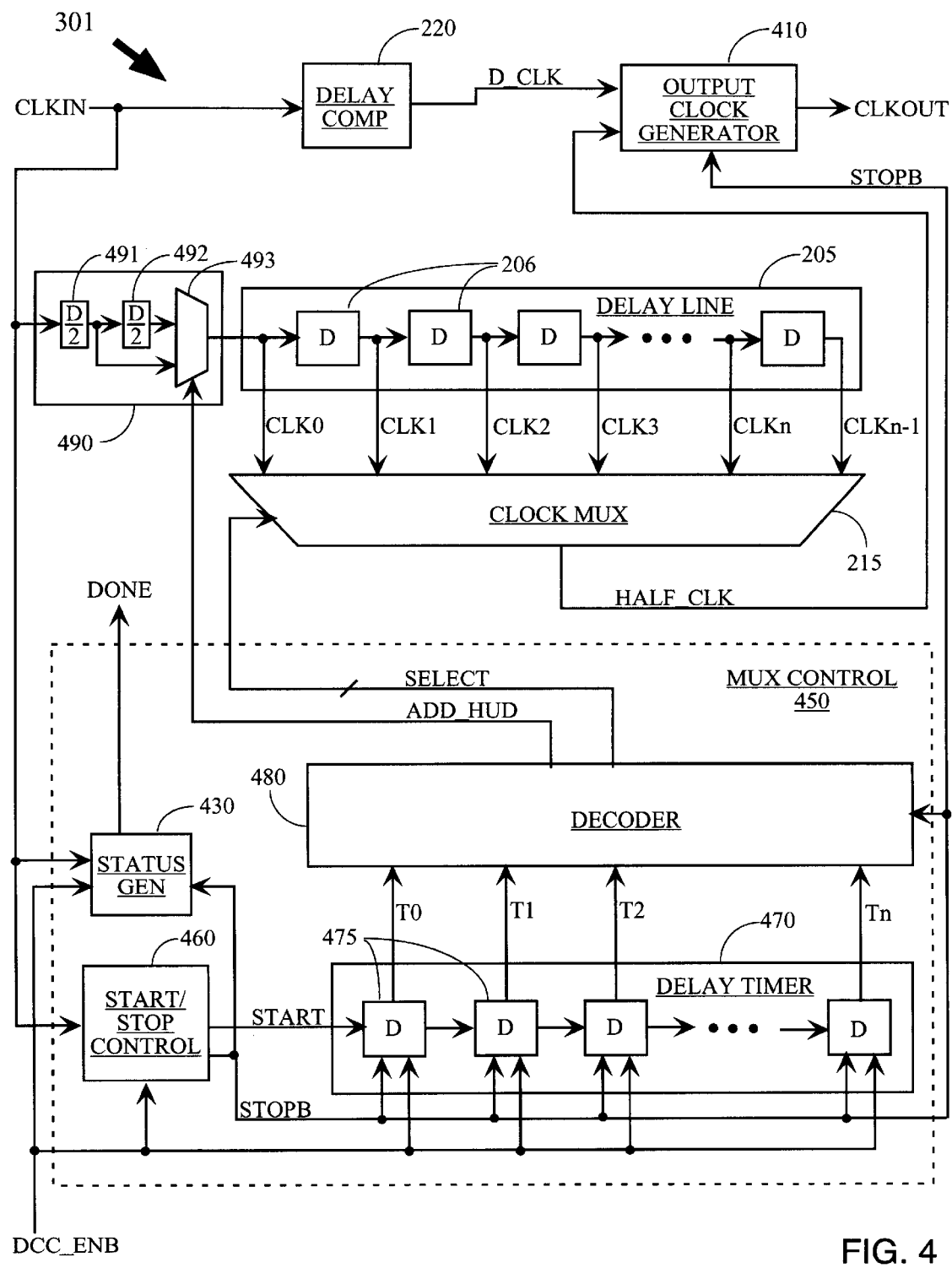
FIG. 4 is a block diagram of a second embodiment of the invention.

FIG. 4 shows a second embodiment of the invention. The embodiment of FIG. 4 includes several optional features not included in the embodiment of FIG. 2. Although these features are all shown in a single embodiment, they can be separately used or omitted, and the resulting circuits fall within the spirit and scope of the invention. The invention includes these and other variations on the basic concepts described herein.

The block diagram shown in FIG. 4 is similar to that of FIG. 2, and therefore is not described in detail here, except where the embodiment of FIG. 4 differs from that of FIG. 2. However, logic blocks that were previously described only in terms of their function are shown in more detail in relation to this embodiment.

Figure 5A:
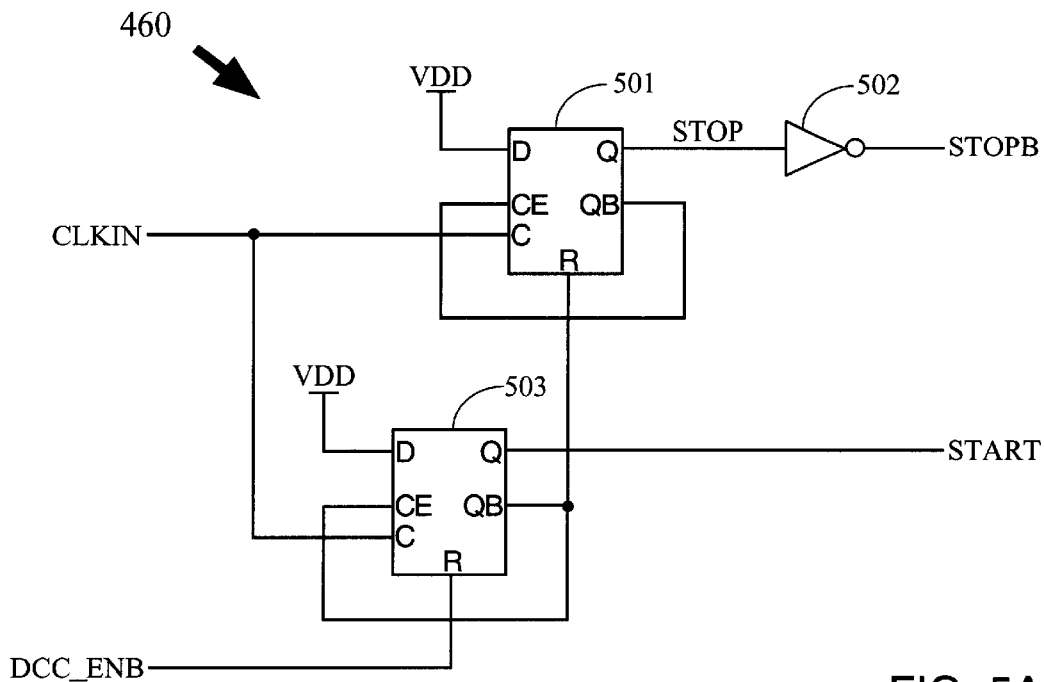
FIG. 5A is a block diagram of a Start/Stop control circuit that can be used with the embodiment of FIG. 4.

FIG. 5A is a block diagram of a Start/Stop control circuit that can be used with the embodiment of FIG. 4. Input signals to the control circuit include input clock signal CLKIN and an enable/disable control signal DCC_ENB, which has several functions in the embodiment of FIG. 4. For example, enable/disable control signal DCC_ENB provides the reset function for the Start/Stop control circuit. Output signals from Start/Stop control circuit 460 include control signals STOPB and START, which control delay timer 470, decoder 480, output clock generator 410, and status generator 430.

Start/Stop control circuit 460 includes flip-flop 503, which provides control signal START from its non-inverting output terminal Q; flip-flop 501; and inverting buffer 502, which is driven by the non-inverted output terminal Q of flip-flop 501 (signal STOP) and provides control signal STOPB. The data input terminal D of each flip-flop 501, 503 is coupled to a fixed high voltage (VDD). The inverted output terminal QB of each flip-flop is coupled to its corresponding clock enable terminal. Therefore, when the flip-flop stores a high value, the clock terminal is effectively disabled and the value stored in the flip-flop does not change until the flip-flop is reset. Flip-flop 503 (providing the START signal) is reset by enable/disable control signal DCC_ENB. Flip-flop 501 (providing the STOPB signal) is reset by the signal STARTB, provided by the inverted output terminal QB of flip-flop 503. Therefore, when the value stored in flip-flop 503 (signal START) goes high, the value stored in flip-flop 501 (signal STOP) goes high one clock cycle later. Both flip-flops continue to store a high value until reset.

Figure 5B:
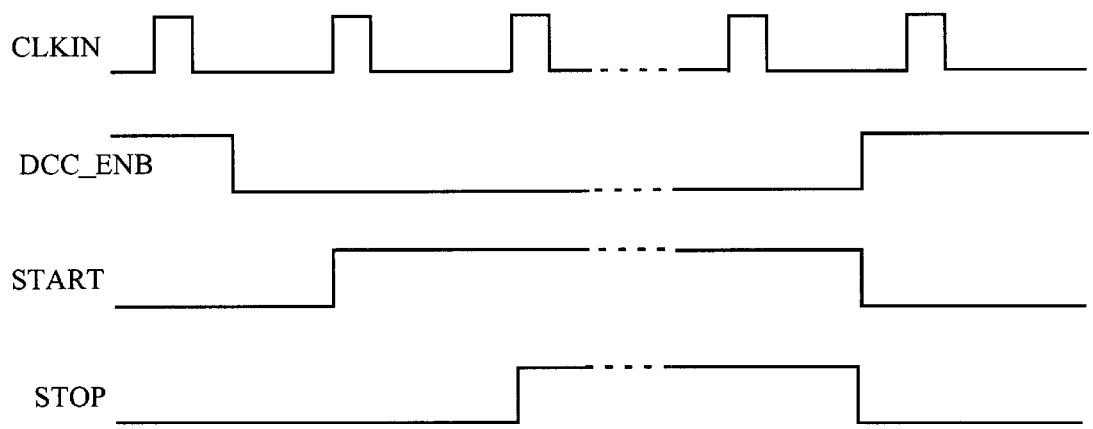
FIG. 5B is a timing diagram showing the interrelationships among the signals of the Start/Stop control circuit shown in FIG. 5A.

FIG. 5B is a timing diagram showing the interrelationships among the signals of the Start/Stop control circuit shown in FIG. 5A. When signal DCC_ENB is high, signal CLKIN is ignored. When signal DCC_ENB goes low, the next rising edge of signal CLKIN results in signal START going high. On the following rising edge of signal CLKIN, signal STOP goes high. When signal DCC_ENB goes high again, both signals START and STOP are reset low, regardless of the state of signal CLKIN.

Figure 6:
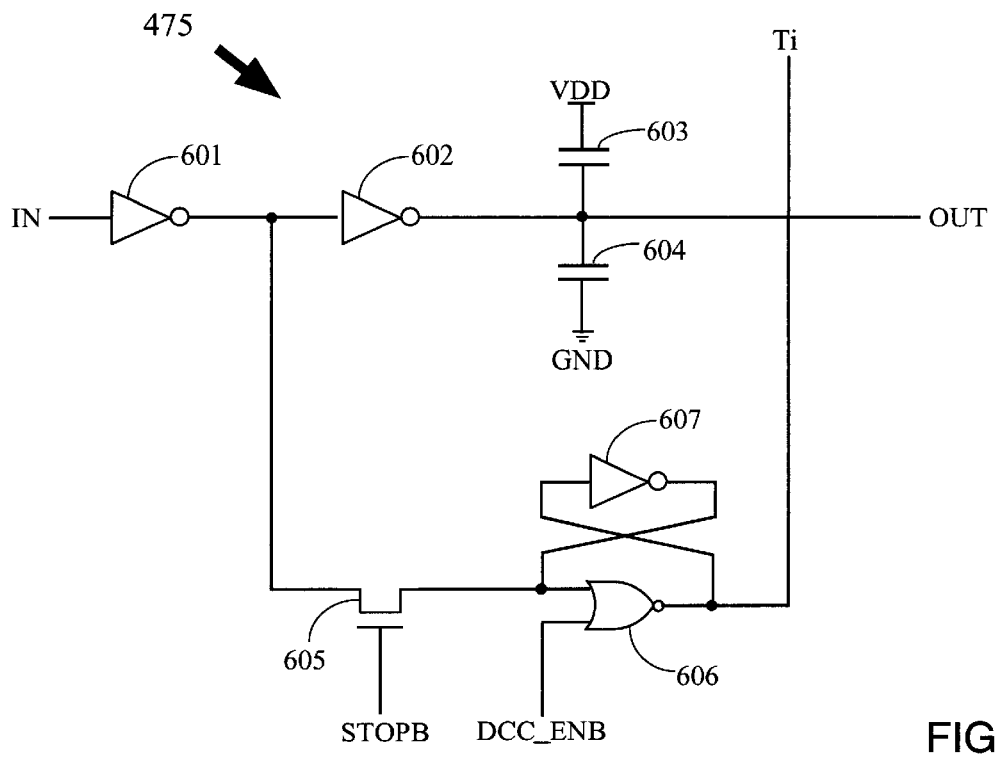
FIG. 6 is a block diagram of a delay element that can be used in the delay timer shown in FIG. 4.

FIG. 6 is a block diagram of a delay element 475 that can be used in delay timer 470 of FIG. 4. Input signal IN is delayed by inverters 601, 602 coupled in series, inverter 602 providing output signal OUT. Capacitor 603 provides a capacitance between output signal OUT and a fixed high voltage (VDD). Capacitor 604 provides a capacitance between output signal OUT and a fixed low voltage (GND). The values of capacitors 603 and 604 are selected such that the delay through delay element 475 is one unit delay, as described above. In one embodiment, the values of capacitors 603 and 604 are programmable, or otherwise adjustable.

The output terminal of inverter 601 is coupled to a first data terminal of a passgate 605, which is controlled by control signal STOPB. The second data terminal of passgate 605 is coupled to a first input terminal of NOR-gate 606 and an output terminal of inverter 607. NOR-gate 606 and inverter 607 are cross-coupled to form a latch. A second input terminal of NOR-gate 606 is coupled to enable/disable control signal DCC_ENB. The output terminal of NOR-gate 606 provides a bit Ti to decoder 480, where i=0, 1, ... n (see FIG. 4).

Delay element 206 of delay line 205 is preferably implemented using inverters and capacitors similar to inverters 601, 602 and capacitors 603, 604, so that the delays are similarly affected by processing and other variations.

Decoder 480, clock multiplexer 215, and delay compensator 220 operate as described throughout the specification. Decoders, multiplexers, and delay elements are notoriously well-known. Therefore, detailed descriptions of these elements are not provided herein.

The embodiment of FIG. 4 allows a closer approximation of the 180 degree offset (or "halfway") point in the input clock period than is achievable in the embodiment of FIG. 2. As described above, the halfway point as determined by the embodiment of FIG. 2 suffers in accuracy if the clock period is an odd number of unit delays in length. Effectively, when the decoder divides the number of unit delays by two, any "odd" unit delay is lost. The embodiment of FIG. 4 adjusts for this error by providing for an additional half-unit delay that can optionally be added at the beginning of the delay line.

Optional half/full unit delay element 490 (see FIG. 4) comprises two half-unit delay elements 491, 492 connected in series, and a 2-to-1 multiplexer 493 selecting between the output signals from the two half-unit delay elements, i.e., selecting either a half-unit delay (from half-unit delay element 491) or a full-unit delay (from half-unit delay element 492). Half-unit delay elements 491, 492 each delay an input signal by one-half of a unit delay (described above). For purposes of this description, it is assumed that the delay through multiplexer 493 is negligible compared to one unit delay. When the delay is not negligible, the delay through multiplexer 493 is compensated for by appropriately reducing the delay through half-unit delay element 491 or by increasing the delay through delay compensator element 220.

Multiplexer 493 is controlled to add either half or a full-unit delay by an additional control signal ADD_HUD (Add Half-Unit Delay), which is provided by decoder 480. The ADD_HUD signal is generated by effectively counting the number of high bits received from delay timer 470 (as described above with regard to FIG. 2), dividing the number by two, and if there is a remainder selecting the half-unit delay path. Note that the SELECT signals for this embodiment differ from those of the embodiment of FIG. 2, because of the additional delay though optional half/full unit delay element 490.

As described above, the embodiment of FIG. 4 uses an enable/disable control signal DCC_ENB. When control signal DCC_ENB is high, the DCC circuit is disabled, and provides an output clock signal that is simply a delayed version of the input clock signal. In other words, no duty cycle correction is performed. When signal DCC_ENB is low, DCC circuit 301 is enabled, and provides an output clock signal CLKOUT with the same period as the input clock signal CLKIN, but with a 50% duty cycle.

In the embodiment of FIG. 4, this enable/disable capability is provided by supplying the STOPB signal (which is set high by enable/disable control signal DCC_ENB) to output clock generator 410. Output clock generator 410 includes an output multiplexer controlled by the STOPB signal, which simply selects the delayed input clock signal D_CLK as output clock signal CLKOUT, rather than selecting the corrected clock signal with the 50% duty cycle.

Figure 7A:
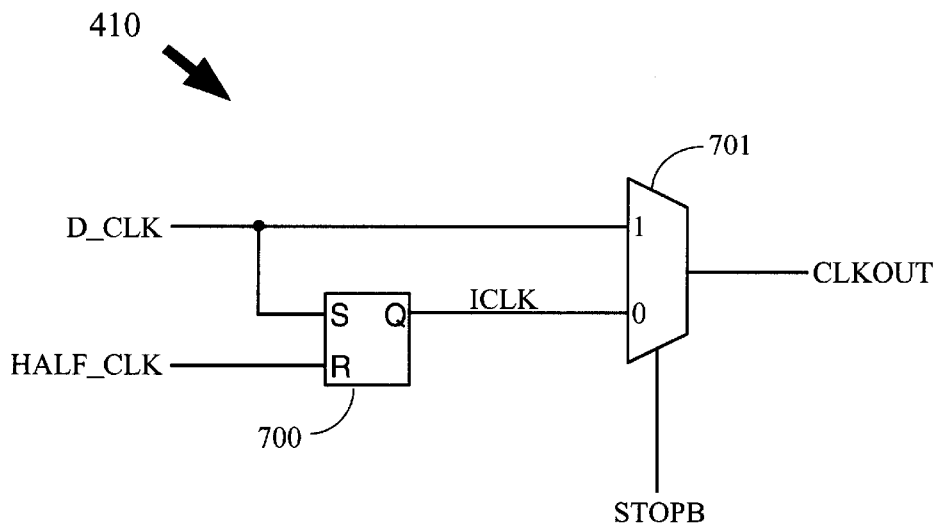
FIG. 7A is a block diagram of a first output clock generator that can be used with the embodiment of FIG. 4.

FIG. 7A is a block diagram of an output clock generator that can be used with the embodiment of FIG. 4. Delayed input clock signal D_CLK drives the set terminal of an SR-latch 700, while selected clock signal HALF_CLK drives the reset terminal. An intermediate signal ICLK is provided by the non-inverted output terminal Q of SR-latch 700. One of delayed clock signal D_CLK and signal ICLK is selected in output multiplexer 701, which provides output clock signal CLKOUT. When signal STOPB is high, signal D_CLK is selected. When signal STOPB is low, signal ICLK is selected.

In another embodiment (not shown), input clock signal CLKIN is provided to output multiplexer 701 instead of delayed input clock signal D_CLK. This modification removes the delay caused by delay compensator 220, therefore, output clock signal CLKOUT more nearly follows input clock signal CLKIN.

Figure 7B:
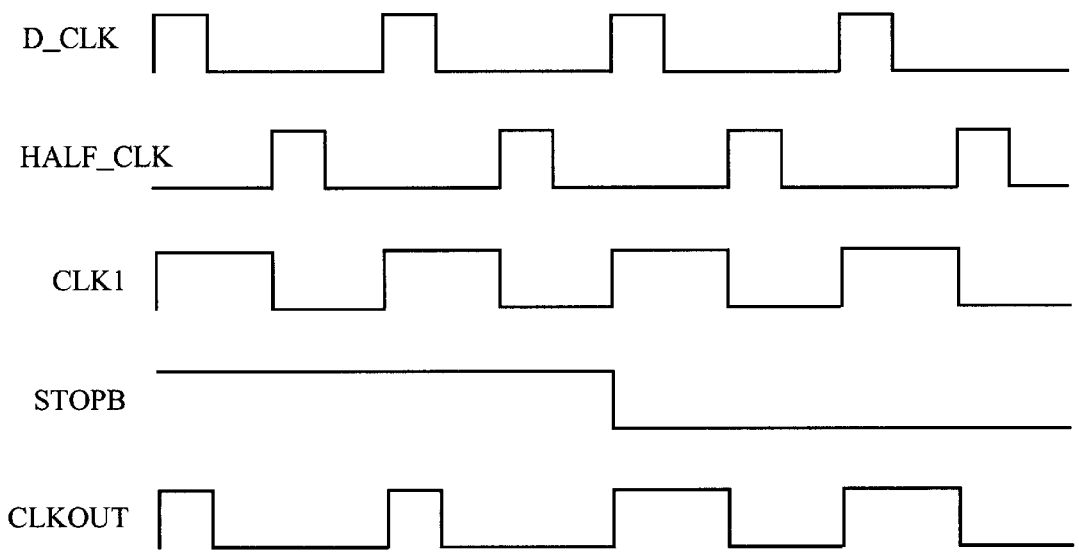
FIG. 7B is a timing diagram showing the interrelationships among the signals of the output clock generator shown in FIG. 7A.

FIG. 7B is a timing diagram showing the interrelationships among the signals of the output clock generator shown in FIG. 7A. As shown in FIG. 7B, signal D_CLK is a periodic signal with a high pulse shorter than the low pulse. Signal HALF_CLK is a periodic signal with the same period as signal D_CLK but delayed by about half a clock cycle. Signal ICLK goes low when signal HALF_CLK goes high, and goes high when signal D_CLK goes high. When signal STOPB is high, output clock signal CLKOUT follows signal D_CLK. When signal STOPB is low, output clock signal CLKOUT follows signal ICLK.

FIGS. 7A and 7B show the case where the duty cycle is weighted in the direction of the low pulse, i.e., the high pulse is shorter than the low pulse. In this case, the D_CLK and HALF_CLK clocks signals do not overlap (see FIG. 7B). Therefore, the set and reset signals of SR-latch 700 are never active at the same time. However, in the case where the duty cycle is weighted in the direction of the high pulse (i.e., the high pulse is longer than the low pulse), then both clock signals are high at the same time, and SR-latch 700 can receive both set and reset pulses at the same time.

Figure 7C:
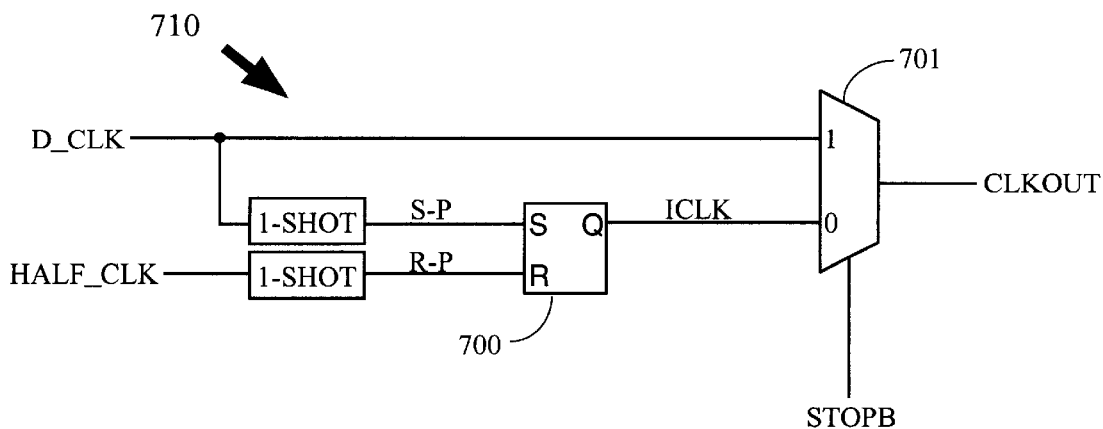
FIG. 7C is a block diagram of a second output clock generator that can be used with the embodiment of FIG. 4.

To avoid this condition, in one embodiment pulse generators ("one-shots") are added to the output clock generator 710 at the input terminals of the SR-latch (see FIG. 7C). (One-shots are notoriously well-known in the art and therefore are not described here in detail.) When the D_CLK clock signal goes high, a brief high pulse is received at the set terminal (signal S-P in FIG. 7C). When the HALF_CLK clock signal goes high, a brief high pulse is received at the reset terminal (signal R-P). Use of these one-shots therefore removes the potential problems caused by the overlap of the clock signals. Further, a circuit including the one-shots functions equally well for duty cycles weighted in the direction of either the low or the high pulse.

Figure 7D:
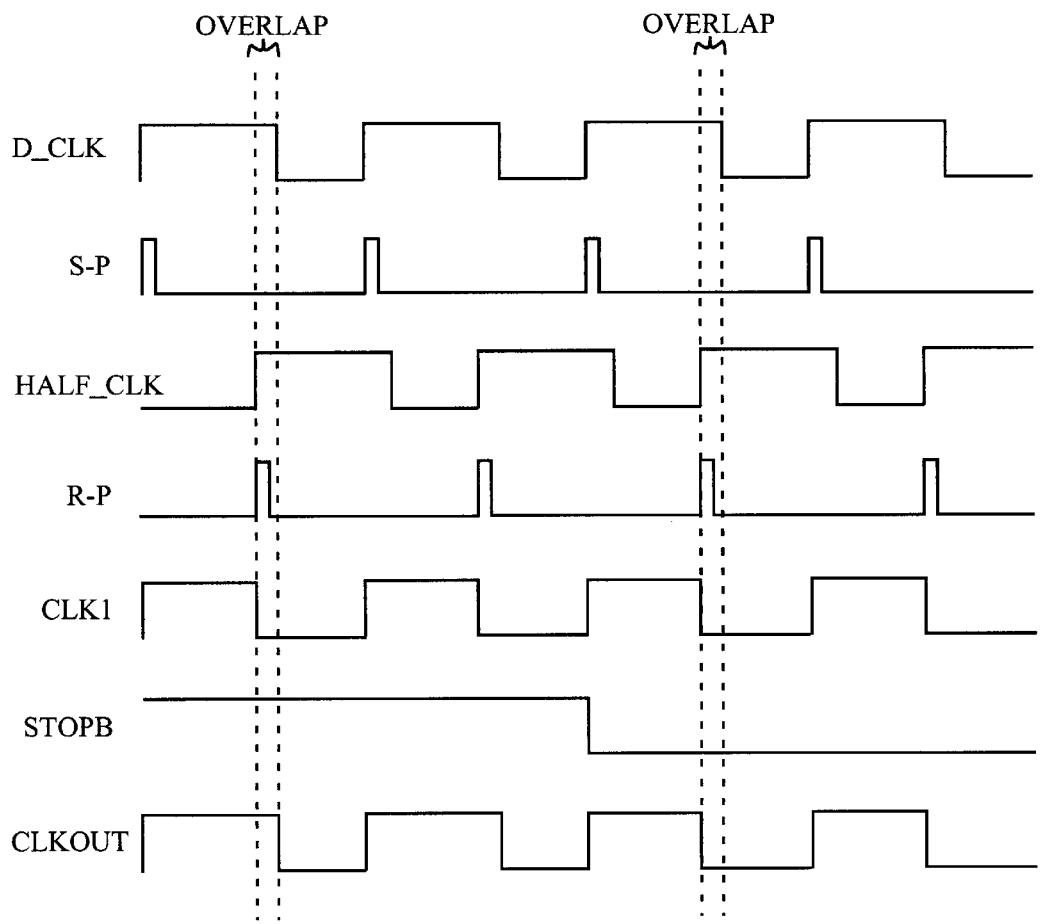
FIG. 7D is a timing diagram showing the interrelationships among the signals of the output clock generator shown in FIG. 7C.

FIG. 7D is a timing diagram showing the interrelationships among the signals of the output clock generator shown in FIG. 7C. As shown in FIG. 7D, signal D_CLK is a periodic signal with a high pulse longer than the low pulse. Signal HALF_CLK is a periodic signal with the same period as signal D_CLK but delayed by about half a clock cycle. Because the high pulse is over half a clock cycle in duration, the two high pulses overlap by a period designated "OVERLAP" in FIG. 7D. However, because signals S-P and R-P are used to set and reset SR-latch 700, there is no overlap between the signals at the set and reset terminals of the latch.

Figure 8:
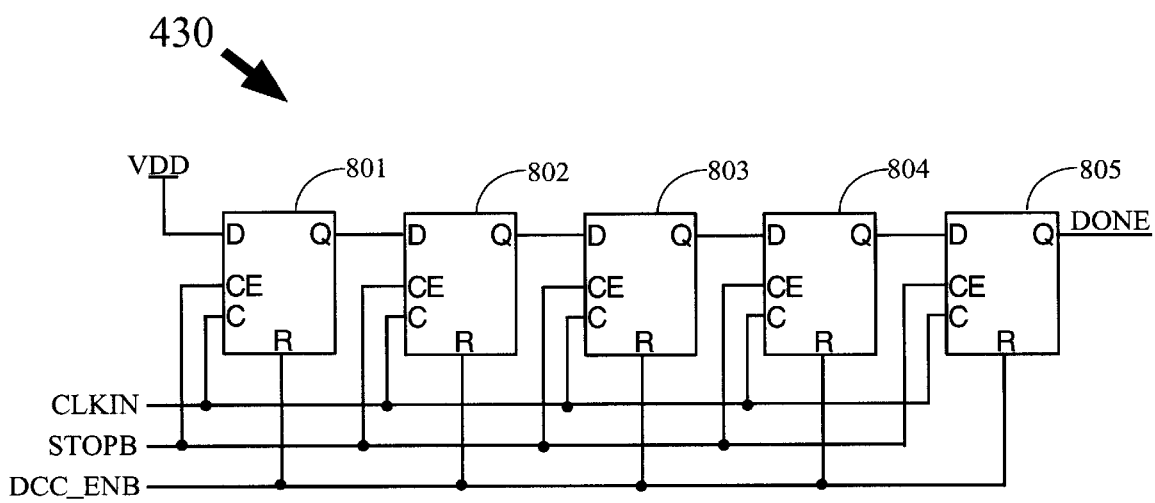
FIG. 8 is a block diagram of a status generator circuit that can be used in the embodiment of FIG. 4.

The embodiment of FIG. 4 also includes a status generator circuit 430 that provides a status signal DONE after a predetermined number of clock cycles have elapsed. FIG. 8 shows an example of such a status circuit. Status generator circuit 430 includes a plurality of flip-flops 801–805 coupled in series and clocked by the input clock signal CLKIN. The data input terminal D of the first flip-flop is coupled to a high voltage (VDD). The flip-flops are reset by a high value on the DCC_ENB signal, and disabled by a low value on the STOPB signal. Therefore, when the DCC circuit is first enabled, all flip-flops store a low value, and status signal DONE is low. Status signal DONE is optionally used by other circuits to disable the output clock signal CLKOUT until the output clock signal has settled into a reliably predictable pattern. The number of flip-flops in status generator circuit 430 can be any integer, depending on the anticipated number of clock cycles required for the output clock signal to settle.

On the first rising edge of the CLKIN signal, flip-flop 801 goes high. On each succeeding edge, one more flip-flop goes high. After five rising edges on input clock signal CLKIN, the status signal DONE goes high. If the STOPB signal goes low (and remains low) after less than five clock cycles, then DONE does not go high. In other embodiments, the status generator circuit is omitted or is otherwise implemented, for example, using a counter.

Those having skill in the relevant arts of the invention will now perceive various modifications and additions that may be made as a result of the disclosure herein. For example, the above text describes the invention in the context of ICs.

However, the invention can also be applied to many other systems, such as a circuit that detects a weak but periodic signal (e.g., a human pulse) and generates a clock therefrom that is used to control a related system (e.g., an apparatus for injecting medicine into the body of the human). Further, clock generators, delay compensators, delay elements, unit delays, delay lines, delay timers, multiplexers, decoders, status generators, and control circuits other than those described herein can be used to implement the invention. Moreover, some components are shown directly connected to one another while others are shown connected via intermediate components. In each instance the method of interconnection establishes some desired electrical communication between two or more circuit nodes. Such communication may often be accomplished using a number of circuit configurations, as will be understood by those of skill in the art. Accordingly, all such modifications and additions are deemed to be within the scope of the invention, which is to be limited only by the appended claims and their equivalents.

What is claimed is:

1. A duty cycle correction circuit, comprising:
   an input clock terminal providing an unsymmetrical input clock signal having an input clock period and an input clock duty cycle;
   a delay line driven by the input clock signal and providing a plurality of intermediate clock signals delayed from the input clock signal by a plurality of unit delays;
   a multiplexer control circuit comprising a delay timer and a decoder, the multiplexer control circuit counting a number of the unit delays in the input clock period and dividing the number by two;
   a clock multiplexer selecting among the intermediate clock signals under control of the multiplexer control circuit to provide a selected clock signal, the selected clock signal being an intermediate clock signal subject to a delay closest to but not exceeding half of one input clock period; and
   an output clock generator driven by the selected clock signal and the input clock signal and providing an output clock signal having an output clock period the same as the input clock period and further having a 50% duty cycle.

2. The duty cycle correction circuit of claim 1, further comprising a delay compensation element having a delay equal to a delay through the clock multiplexer, the delay compensation element being coupled between the input clock terminal and the output clock generator.

3. The duty cycle correction circuit of claim 1, further comprising an enable/disable control terminal coupled to the multiplexer control circuit and providing an enable/disable control signal to the multiplexer control circuit, and wherein:
   when the enable/disable control signal is at a first logic level, the output clock generator provides an output clock signal having an output clock period the same as the input clock period and further having a 50% duty cycle, and
   when the enable/disable control signal is at a second logic level, the output clock generator provides an output clock signal having an output clock duty cycle the same as the input clock duty cycle.

4. A duty cycle correction circuit, comprising:
   an input clock terminal providing an unsymmetrical input clock signal having an input clock period and an input clock duty cycle;
   a delay line driven by the input clock signal and providing a plurality of intermediate clock signals delayed from the input clock signal by a plurality of unit delays;
   a multiplexer control circuit;
   a clock multiplexer selecting among the intermediate clock signals under control of the multiplexer control circuit to provide a selected clock signal, the selected clock signal being an intermediate clock signal subject to a delay closest to but not exceeding half of one input clock period; and
   an output clock generator driven by the selected clock signal and the input clock signal and providing an output clock signal having an output clock period the same as the input clock period and further having a 50% duty cycle,
   wherein the multiplexer control circuit comprises:
      a delay timer comprising a series of delay elements each having a delay equal to the unit delay of the delay line, the delay timer providing a series of bits indicative of the number of unit delays in one input clock period; and
      a decoder that receives the series of bits and provides therefrom a plurality of select signals for controlling the clock multiplexer.

5. The duty cycle correction circuit of claim 4, wherein:
   the multiplexer control circuit further comprises a start/stop control circuit, the start/stop control circuit providing to the delay timer a first signal responsive to a first instance of a first edge of the input clock signal, and a second signal responsive to a second instance of the first edge of the input clock signal; and
   the first and second signals enable the delay timer to count the number of unit delays between the first and second instances of the first edge of the input clock signal.

6. A duty correction circuit, comprising:
   an input clock terminal providing an unsymmetrical input clock signal having an input clock period and an input clock duty cycle;
   a delay line driven by the input clock signal and providing a plurality of intermediate clock signals delayed from the input clock signal by a plurality of unit delays;
   a multiplexer control circuit;
   a clock multiplexer selecting among the intermediate clock signals under control of the multiplexer control circuit to provide a selected clock signal, the selected clock signal being an intermediate clock signal subject to a delay closest to but not exceeding half of one input clock period; and
   an output clock generator driven by the selected clock signal and the input clock signal and providing an output clock signal having an output clock period the same as the input clock period and further having a 50% duty cycle,
   wherein the delay line comprised a delay element selectably providing half of the unit delay, thereby delaying each of the plurality of intermediate clock signals by half of the unit delay.

7. A method of correcting the duty cycle of an input clock signal, the method comprising:
   receiving an unsymmetrical input clock signal having an input clock period and an input clock duty cycle;
   providing from the input clock signal a plurality of intermediate clock signals delayed form the input clock signals by a plurality of unit delays;
   selecting from among the intermediate clock signals a selected clock signal, the selection being made based on a number of unit delays in one input clock period, the selected clock signal being an intermediate clock signal subject to a delay closest to but not exceeding half off one input clock period; and providing from the selected clock signal and the input clock signal an output clock signal having an output clock period the same as the input clock period and further having a 50% duty cycle.

8. The method of claim 7, wherein providing an output clock signal comprises delaying the input clock signal by a delay equal to a delay incurred while selecting from among the intermediate clock signals.

9. The method of claim 7, further comprising:

providing an enable/disable control signal;

when the enable/disable control signal is at a first logic level, providing from the selected clock signal and the input clock signal an output clock signal having an output clock period the same as the input clock period and further having a 50% duty cycle; and when the enable/disable control signal is at a second logic level, providing an output clock signal having an output clock duty cycle the same as the input clock duty cycle.

10. A method of correcting the duty cycle of an input clock signal, the method comprising:

receiving an unsymmetrical input clock signal having an input clock period and an input clock duty cycle;

providing from the input clock signal a plurality of intermediate clock signals delayed from the input clock signal by a plurality of unit delays;

selecting from among the intermediate clock signals a selected clock signal, the selected clock signal being an intermediate clock signal subject to a delay closest to but not exceeding half of one input clock period; and providing from the selected clock signal and the input clock signal an output clock signal having an output clock period the same as the input clock period and further having a 50% duty cycle, wherein selecting from among the intermediate clock signals a selected clock signal comprises:

counting a number of unit delays in one input clock period; and decoding the number of unit delays to select from among the intermediate clock signals the selected clock signal.

11. The method of claim 10, wherein counting a number of unit delays in one input clock period comprises:

providing a first control signal responsive to a first instance of a first edge of the input clock signal;

providing a second control signal responsive to a second instance of the first edge of the input clock signal; and counting the number of unit delays between the first and second instances of the first edge of the input clock signal.

12. A method of correcting the duty cycle of an input clock signal, the method comprising:

receiving an unsymmetrical input clock signal having an input clock period and an input clock duty cycle;

providing from the input clock signal a plurality of intermediate clock signals delayed from the input clock signal by a plurality of unit delays;

selecting from among the intermediate clock signals a selected clock signal, the selected clock signal being an intermediate clock signal subject to a delay closest to but not exceeding half of one input clock period; and providing from the selected clock signal and the input clock signal an output clock signal having an output clock period the same as the input clock period and further having a 50% duty cycle, wherein providing from the input clock signal a plurality of intermediate clock signals delayed from the input clock signal by a plurality of unit delays further comprises selectably delaying each of the plurality of intermediate clock signals by half of the unit delay.

13. A duty cycle correction circuit, comprising:

means for receiving an unsymmetrical input clock signal having an input clock period and an input clock duty cycle;

means for providing from the input clock signal a plurality of intermediate clock signals delayed from the input clock signal by a plurality of unit delays;

means for selecting from among the intermediate clock signals a selected clock signal, the selection being made based on a number of unit delays in one input clock period, the selected clock signal being an intermediate clock signal subject to a delay closest to but not exceeding half of one input clock period; and means for providing from the selected clock signal and the input clock signal an output clock signal having an output clock period the same as the input clock period and further having a 50% duty cycle.

14. The duty cycle correction circuit of claim 13, wherein the means for providing an output clock signal comprises means for delaying the input clock signal by a delay equal to a delay incurred while selecting from among the intermediate clock signals.

15. The duty cycle correction circuit of claim 13, further comprising:

means for providing an enable/disable control signal;

means for providing, when the enable/disable control signal is at a first logic level, from the selected clock signal and the input clock signal an output clock signal having an output clock period the same as the input clock period and further having a 50% duty cycle; and means for providing, when the enable/disable control signal is at a second logic level, an output clock signal having an output clock duty cycle the same as the input clock duty cycle.

16. A duty cycle correction circuit, comprising:

means for receiving an unsymmetrical input clock signal having an input clock period and an input clock duty cycle;

means for providing from the input clock signal a plurality of intermediate clock signals delayed from the input clock signal by a plurality of unit delays;

means for selecting from among the intermediate clock signals a selected clock signal, the selected clock signal being an intermediate clock signal subject to a delay closest to but not exceeding half of one input clock period; and means for providing from the selected clock signal and the input clock signal an output clock signal having an output clock period the same as the input clock period and further having a 50% duty cycle, wherein the means for selecting from among the intermediate clock signals a selected clock signal comprises:

means for counting a number of unit delays in one input clock period; and means for decoding the number of unit delays to select from among the intermediate clock signals the selected clock signal.

17. The duty cycle correction circuit of claim 16, wherein the means for counting a number of unit delays in one input clock period comprises:

means for providing a first control signal responsive to a first instance of a first edge of the input clock signal;

means for providing a second control signal responsive to a second instance of the first edge of the input clock signal; and means for counting the number of unit delays between the first and second instances of the first edge of the input clock signal.

18. A duty cycle correction circuit, comprising:

means for receiving an unsymmetrical input clock signal having an input clock period and an input clock duty cycle;

means for providing from the input clock signal a plurality of intermediate clock signals delayed from the input clock signal by a plurality of unit delays;

means for selecting from among the intermediate clock signals a selected clock signal, the selected clock signal being an intermediate clock signal subject to a delay closest to but not exceeding half of one input clock period; and means for providing from the selected clock signal and the input clock signal an output clock signal having an output clock period the same as the input clock period and further having a 50% duty cycle, wherein the means for providing from the input clock signal a plurality of intermediate clock signals delayed from the input clock signal by a plurality of unit delays further comprises means for selectably delaying each of the plurality of intermediate clock signals by half of the unit delay.

\* \* \* \* \*